(12) United States Patent
Fujiwara et al.

(10) Patent No.: US 7,973,412 B2
(45) Date of Patent: Jul. 5, 2011

(54) SEMICONDUCTOR DEVICE USING LEAD-FREE SOLDER AS DIE BONDING MATERIAL AND DIE BONDING MATERIAL NOT CONTAINING LEAD

(75) Inventors: Seiji Fujiwara, Kyoto (JP); Yoshihiro Tomita, Osaka (JP); Akio Furusawa, Osaka (JP); Kenichirou Suetugu, Hyogo (JP)

(73) Assignee: Panasonic Corporation, Osaka (JP)

( * ) Notice: Subject to any disclaimer, the term of this patent is extended or adjusted under 35 U.S.C. 154(b) by 301 days.

(21) Appl. No.: 12/342,347

(22) Filed: Dec. 23, 2008

(65) Prior Publication Data
US 2009/0166876 A1    Jul. 2, 2009

(30) Foreign Application Priority Data

Dec. 27, 2007    (JP) .................... 2007-335423

(51) Int. Cl.
*H01L 23/48* (2006.01)
*H01L 21/52* (2006.01)
*C22C 12/00* (2006.01)
*B23K 35/26* (2006.01)

(52) U.S. Cl. ............ 257/772; 257/E23.052; 257/675; 257/676; 257/784; 257/786; 257/684; 257/796; 174/259; 420/577

(58) Field of Classification Search ............ 257/772, 257/E23.052, 675, 676, 784, 786, 684, 796; 174/259; 420/577
See application file for complete search history.

(56) References Cited

U.S. PATENT DOCUMENTS

| | | | | |
|---|---|---|---|---|
| 4,663,649 A | * | 5/1987 | Suzuki et al. | 257/746 |
| 4,935,336 A | * | 6/1990 | Yamada et al. | 430/270.12 |
| 6,365,097 B1 | | 4/2002 | Yamashita et al. | 420/561 |
| 6,554,180 B1 | | 4/2003 | Katoh et al. | 228/224 |
| 6,703,113 B2 | | 3/2004 | Takaoka et al. | 428/209 |
| 7,345,570 B2 | * | 3/2008 | Kawanishi | 337/142 |
| 2002/0012608 A1 | * | 1/2002 | Takaoka et al. | 420/561 |
| 2002/0106302 A1 | | 8/2002 | Habu et al. | 420/561 |
| 2003/0111728 A1 | * | 6/2003 | Thai et al. | 257/735 |
| 2004/0170524 A1 | * | 9/2004 | Lambracht et al. | 420/577 |
| 2005/0029666 A1 | * | 2/2005 | Kurihara et al. | 257/772 |
| 2005/0218525 A1 | | 10/2005 | Takahashi et al. | 257/772 |
| 2006/0239854 A1 | * | 10/2006 | Uenishi et al. | 420/501 |
| 2009/0242249 A1 | * | 10/2009 | Furusawa et al. | 174/259 |
| 2010/0294550 A1 | * | 11/2010 | Furusawa et al. | 174/259 |

FOREIGN PATENT DOCUMENTS

| | | | | |
|---|---|---|---|---|
| JP | 2006-167790 A | * | 6/2006 | |
| JP | 2007-90407 A | * | 4/2007 | |
| JP | 2007-313526 | | 12/2007 | |
| WO | WO 02/097145 | | 12/2002 | |
| WO | WO 2007/136009 | | 11/2007 | |

* cited by examiner

*Primary Examiner* — Alexander O Williams
(74) *Attorney, Agent, or Firm* — Steptoe & Johnson LLP

(57) ABSTRACT

In a semiconductor device bonded to a motherboard with a bonding material having a melting point of 200° C. to 230° C., a bonding material 15 which is a die bonding material for bonding a semiconductor element 13 to a semiconductor substrate 11 is a Bi alloy containing 0.8 wt % to 10 wt % of Cu and 0.02 wt % to 0.2 wt % of Ge, so that the bonding material 15 for bonding the semiconductor element 13 to the semiconductor substrate 11 is not melted when the semiconductor device is bonded to the motherboard by reflowing. It is therefore possible to suppress poor connection on the semiconductor element 13, thereby securing the mountability and electrical reliability of the semiconductor device.

12 Claims, 8 Drawing Sheets

CROSS-SECTIONAL DISTANCE FROM MOUNTING SURFACE (mm)

| | Ag | Al | Au | Bi | Co | Cr | Cu | Ga | Ge | In | Mg | Mn | Mo | Ni | Pd | Pt | Si | Sn | Zn |
|---|---|---|---|---|---|---|---|---|---|---|---|---|---|---|---|---|---|---|---|
| Ag | | | | | | | | | | | | | | | | | | | |
| Al | 556 | | | | | | | | | | | | | | | | | | |
| Au | - | 525 | | | | | | | | | | | | | | | | | |
| Bi | 262 | 657 | 241 | | | | | | | | | | | | | | | | |
| Co | UNCERTAIN | 657 | 996 | UNCERTAIN | | | | | | | | | | | | | | | |
| Cr | UNCERTAIN | - | - | UNCERTAIN | 1395 | | | | | | | | | | | | | | |
| Cu | 779 | 548 | - | 270 | - | 1076 | | | | | | | | | | | | | |
| Ga | 25 | 26.4 | 339 | 222 | UNCERTAIN | UNCERTAIN | - | | | | | | | | | | | | |
| Ge | 651 | 424 | 356 | 271 | 810 | 390 | 640 | 29.3 | | | | | | | | | | | |
| In | 141 | 637 | 450 | 72 | UNCERTAIN | UNCERTAIN | 150 | 15.7 | - | | | | | | | | | | |
| Mg | 471 | 437 | 576 | 260 | UNCERTAIN | UNCERTAIN | 485 | 423 | 635 | - | | | | | | | | | |
| Mn | - | 650 | 960 | 262 | - | - | - | UNCERTAIN | UNCERTAIN | UNCERTAIN | UNCERTAIN | | | | | | | | |
| Mo | UNCERTAIN | 1500 | UNCERTAIN | - | 1340 | - | - | UNCERTAIN | UNCERTAIN | UNCERTAIN | UNCERTAIN | UNCERTAIN | | | | | | | |
| Ni | 1435 | 640 | - | - | - | 1345 | - | 1200 | 775 | 920 | 506 | - | 1309 | | | | | | |
| Pd | - | 615 | 363 | UNCERTAIN | - | 1315 | - | UNCERTAIN | UNCERTAIN | - | UNCERTAIN | 1147 | 1700 | - | | | | | |
| Pt | - | 1400 | 217 | UNCERTAIN | - | 1500 | - | UNCERTAIN | UNCERTAIN | - | UNCERTAIN | - | 2080 | - | - | | | | |
| Si | 940 | 577 | 363 | UNCERTAIN | 1260 | 1320 | 802 | 20.5 | 232 | - | 640 | UNCERTAIN | 1410 | 966 | 816 | 830 | | | |
| Sn | 221 | 228 | 217 | 138 | 229 | UNCERTAIN | 227 | 20.5 | 232 | 120 | 200 | 1147 | UNCERTAIN | 1130 | 1210 | 228 | UNCERTAIN | | |
| Zn | - | 382 | 630 | 255 | - | UNCERTAIN | - | 25 | 398 | 143 | 364 | - | UNCERTAIN | 419 | UNCERTAIN | - | 419 | 198 | |

FIG. 5

SEMICONDUCTOR DEVICE USING LEAD-FREE SOLDER AS DIE BONDING MATERIAL AND DIE BONDING MATERIAL NOT CONTAINING LEAD

FIELD OF THE INVENTION

The present invention relates to a die bonding material used for bonding a semiconductor element and a semiconductor substrate, and a semiconductor device using the die bonding material.

BACKGROUND OF THE INVENTION

A semiconductor element mounted on a semiconductor substrate includes electrodes electrically connected to a semiconductor substrate having external terminal electrodes, and a bonding material used for bonding is generally a solder material. In die bonding of the semiconductor element, attention should be given to the elemental components of a die bonding material. When die-bonding the semiconductor element, it is necessary to select a die bonding material which is electrically connected to the semiconductor substrate without inclining the semiconductor element or causing voids.

The semiconductor device is mounted on a motherboard with another bonding material that is generally a solder material having a melting point of 200° C. to 230° C.

When the semiconductor device is mounted on the motherboard, the semiconductor device is prepared to be fixed on a predetermined position on the motherboard with the solder material and the semiconductor device is heated with the motherboard mainly by reflow equipment of a hot-air system to melt the solder material having a melting point of 200° C. to 230° C. At this point, the temperature of the semiconductor device reaches 230° C. to 260° C. When the solder material for bonding the semiconductor element and semiconductor substrate electrodes is melted in the semiconductor device, a movement of the solder material causes an unexpected electrical connection which may result in a failure. Thus the bonding material used in the semiconductor device is required to have a higher melting temperature than the maximum temperature reached by the semiconductor device in the reflow equipment. Further, it is necessary to prevent the generation of an intermetallic compound which reduces the melting point of the die bonding material, and thus it is important to select a material according to a temperature and the number of processes. Moreover, attention should be given to exfoliation caused by mechanical strength degradation on a joint.

A solder material containing tin as a composition forms an intermetallic compound layer with a metal of a bonded material, and the intermetallic compound layer changes with time and causes mechanical strength degradation on a joint.

Thus in a semiconductor device of the prior art, a solder material for bonding a semiconductor element and semiconductor substrate electrodes is, for example, a Pb—Sn alloy which contains lead as a main component, contains about 3 wt % of Sn, and has a melting temperature of 319° C.

However, of die bonding materials for a semiconductor element of the prior art, lead-tin (Pb—Sn) solder and tin-antimony (Sn—Sb) solder contain lead (Pb) and antimony (Sb) as metals and are not expected to be used as die bonding materials in the future. Thus lead-tin solder and tin-antimony solder are not proper as die bonding materials. Particularly, when lead is used, the lead may be released to soil from a solder material in waste. In recent years, there has been a growing interest in global environmental protection and solder not containing lead (lead-free solder) has been developed.

For example, solder materials composed of a Pb—Sn alloy having a melting temperature of 200° C. to 250° C. have been replaced with solder materials composed of one of a Sn—Ag alloy and a Sn—Cu alloy. As a solder material having a melting temperature of at least 260° C., a solder material containing Bi as a main component and a small amount of Ag has been proposed.

However, solder using silver (Ag) and gold (Au), which are expensive metals, is an expensive die bonding material and thus increases the production cost. Lead-indium (Pb—In) solder contains lead (Pb) and has a low melting point of 173° C., so that Pb—In solder is not proper as a die bonding material of a semiconductor element for power in which heat is generated during an operation.

Thus a solder material for electronic components has been proposed in which a bonding material containing an alloy predominantly composed of Bi is used. The alloy contains 0.2 wt % to 0.8 wt % of Cu and one of 0.02 wt % to 0.2 wt % of Ge and 0.02 wt % to 0.08 wt % of Ni.

DISCLOSURE OF THE INVENTION

In the prior art, however, when a die bonding material used for soldering is a bonding material of an alloy which is predominantly composed of Bi and contains 0.2 wt % to 0.8 wt % of Cu and 0.02 wt% to 0.2 wt % of Ge, the melting point is close to a temperature at which a semiconductor device is mounted on a motherboard by reflowing and the like. Thus the melting point has to be further increased to improve mounting reliability.

An object of the present invention is to provide an inexpensive bonding material which has a satisfactory melting temperature of, for example, at least 280° C. and is lead-free, and to secure the mountability and electrical reliability of a semiconductor device.

In order to attain the object, a semiconductor device of the present invention is a semiconductor device having a semiconductor element mounted on a semiconductor substrate, the semiconductor device including: at least one external metal terminal formed on the semiconductor substrate; a joint for electrically connecting the semiconductor element and the semiconductor substrate via electrodes; and a die bonding material made of an alloy predominantly composed of Bi for bonding the semiconductor element and the semiconductor substrate, wherein the alloy contains 0.8 wt % to 10 wt % of Cu and 0.02 wt % to 0.2 wt % of Ge.

Furthermore, the alloy contains 0.8 wt % to 3.8 wt % of Cu and 0.02 wt % to 0.05 wt % of Ge.

The alloy further contains 0.02 wt % to 0.08 wt % of Ni.

The alloy further contains 0.02 wt % to 0.05 wt % of Ni.

Further, the die bonding material of the present invention is a die bonding material for bonding the semiconductor element to the semiconductor substrate and is an alloy which is predominantly composed of Bi and contains 0.8 wt % to 10 wt % of Cu and 0.02 wt % to 0.2 wt % of Ge.

Furthermore, the alloy contains 0.8 wt % to 3.8 wt % of Cu and 0.02 wt % to 0.05 wt % of Ge.

The alloy further contains 0.02 wt % to 0.08 wt % of Ni.

The alloy further contains 0.02 wt % to 0.05 wt % of Ni.

BRIEF DESCRIPTION OF THE DRAWINGS

FIG. 5 shows the eutectic point temperatures of binary alloys;

DESCRIPTION OF THE EMBODIMENTS

First Embodiment

Figure 1:
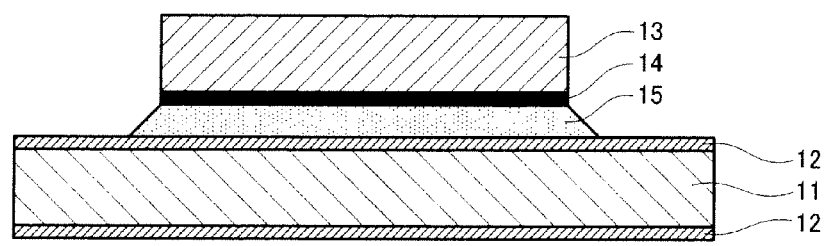
FIG. 1 shows the configuration of a semiconductor device according to the present invention.

A bonding material which is a die bonding material for bonding a semiconductor element according to the present embodiment contains an alloy predominantly composed of Bi. The alloy contains 0.8 wt % to 10 wt % of Cu and 0.02 wt % to 0.2 wt % of Ge. It is known that a melting point increases as a larger amount of Cu having a melting point of 1083° C. is applied to the alloy predominantly composed of Bi having a melting point of 270° C. In order to evenly apply 0.8 wt % to 10 wt % of Cu as an alloy, it is necessary to prevent Cu particles from growing in size by temporarily melting Cu in a melting pot at 1200° C. and increasing the cooling speed. Further, a preferable Cu content is 0.8 wt % to 3.8 wt % and a preferable Ge content is 0.02 wt % to 0.05 wt %. When the alloy predominantly composed of Bi is a ternary alloy (an alloy composed of three elements), the residue other than Cu and Ge is only composed of Bi.

Such a bonding material has a melting temperature of at least 280° C. and thus is properly used for mounting, for example, a semiconductor element for power in a small semiconductor device of surface-mount type. Since the bonding material used in the semiconductor device has a high melting temperature, failures are suppressed in the semiconductor device when the semiconductor device is mounted on a motherboard with reflow equipment. Further, the bonding material of the present embodiment does not contain expensive elements (for example, Ag and Au) and thus can be manufactured at low cost. Moreover, the bonding material does not contain lead and thus can be provided as a lead-free material.

When the bonding material having a melting temperature of at least 280° C. is obtained, it is effective to use a binary alloy (an alloy composed of two elements), which has a eutectic point temperature of at least 280° C., as a base (base material). When selecting a combination of elements having a eutectic point temperature of at least 280° C. from a number of elements, it is important to consider the presence or absence of toxicity of the elements and the prices of the elements. Elements such as Pb, Hg, Sb, and Se are to be withdrawn in view of toxicity.

FIG. 5 shows the eutectic point temperatures of binary alloys. A numeric value on the intersection point of an element disposed on the vertical line and an element disposed on the horizontal line is the eutectic point temperature of an alloy composed of the two elements. FIG. 5 shows that, for example, a Sn—Ag alloy has a eutectic point temperature of 221° C. and a Ni—Cu alloy does not have a eutectic point. Further, it is understood that one of a combination of Bi and Cu and a combination of Bi and Ge can provide an alloy having a eutectic point temperature of a 270° C. to 300° C.

In FIG. 5, a eutectic alloy of Bi and Cu contains 99.5 wt % of Bi and 0.5 wt % of Cu (Bi-0.5% Cu). A eutectic alloy of Bi and Ge contains 99 wt % of Bi and 1 wt % of Ge (Bi-1% Ge). However, Ge is about 420 times as expensive as Cu. Thus the combination of Bi and Cu is more advantageous in view of a reduction in material cost.

Figure 6:
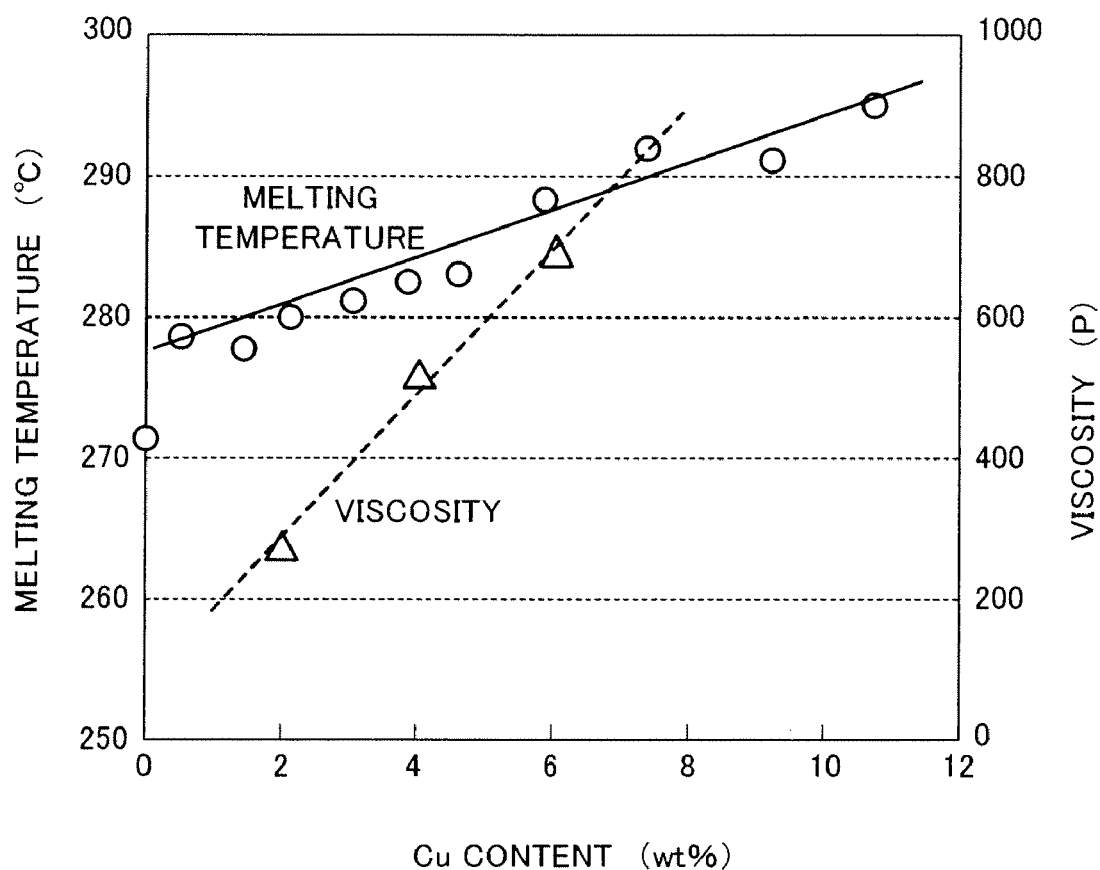
FIG. 6 shows the relationship between a Cu content in a Bi—Cu binary alloy and a melting point and a viscosity of the Bi—Cu alloy.

FIG. 6 shows the relationship between a Cu content (wt %) in a binary alloy of Bi and Cu (Bi—Cu alloy) and a melting point (one of a liquid phase temperature and a solid phase temperature) of the Bi—Cu alloy.

In FIG. 6, the larger the Cu content, the higher the melting point. When the Cu content is 0.8 wt %, the melting point reaches 280° C. which is a target temperature. The bonding material is liquefied and kept in the melting pot in which a heater is wound so as to have a melting point not lower than the melting point of the bonding material in a uniform and stable temperature condition, the melting pot having a discharge end shaped to control the bonding material to a necessary amount. A semiconductor substrate is placed as a target to which the liquefied bonding material is to be discharged under the melting pot. The bonding material is discharged by applying a pressure from the top of the melting pot and the discharge amount is controlled according to a time for applying the pressure. In this case, the smaller the difference between the liquid phase temperature and the solid phase temperature in the bonding material, the higher the workability. The heater temperature of the melting pot is set higher than the liquid phase temperature by 30° C. to 50° C. in consideration of the stability of work. Thus a Cu content not larger than 10 wt % does not cause any problems. However, when the Cu content is at least 3.8 wt %, a ratio of Cu incapable of forming an alloy with Bi increases and thus the viscosity also increases, resulting in lower workability and wettability. On the other hand, when the Cu content is less than 0.8 wt %, the melting point falls below a target value and increases the possibility of a reduction in wettability between electrodes and the like and the bonding material having been melted by remelting in reflowing during secondary mounting. Consequently, it is desirable that the Cu content is at least 0.8 wt %.

As has been discussed, the Cu content is desirably set at 0.8 wt % to 10 wt %. Further, by setting the Cu content at 0.8 wt % to 3.8 wt %, it is possible to obtain a bonding material with more excellent balance of properties for enhancing workability. This bonding material can be easily obtained particularly by winding the heater in a uniform and stable temperature condition which is higher than the liquid phase temperature of the bonding material by 30° C. to 50° C.

A Bi—Cu alloy containing 0.2 wt % to 0.8 wt % of Cu is an excellent bonding material in that the alloy does not melt at a temperature less than 270° C. However, it has been found that wettability is low in a test of meniscus method. The Bi—Cu alloy contains a large amount of Bi, that is, 99.5 wt % of Bi. Thus it is considered that a large amount of oxide is generated in the alloy and affects the wettability. Further, it is considered that the oxidation of Bi can be suppressed by adding to the Bi—Cu alloy a small amount of an element undergoing oxidation prior to Bi. The element undergoing oxidation prior to Bi includes Ge, Al, Li, and P.

Figure 7:
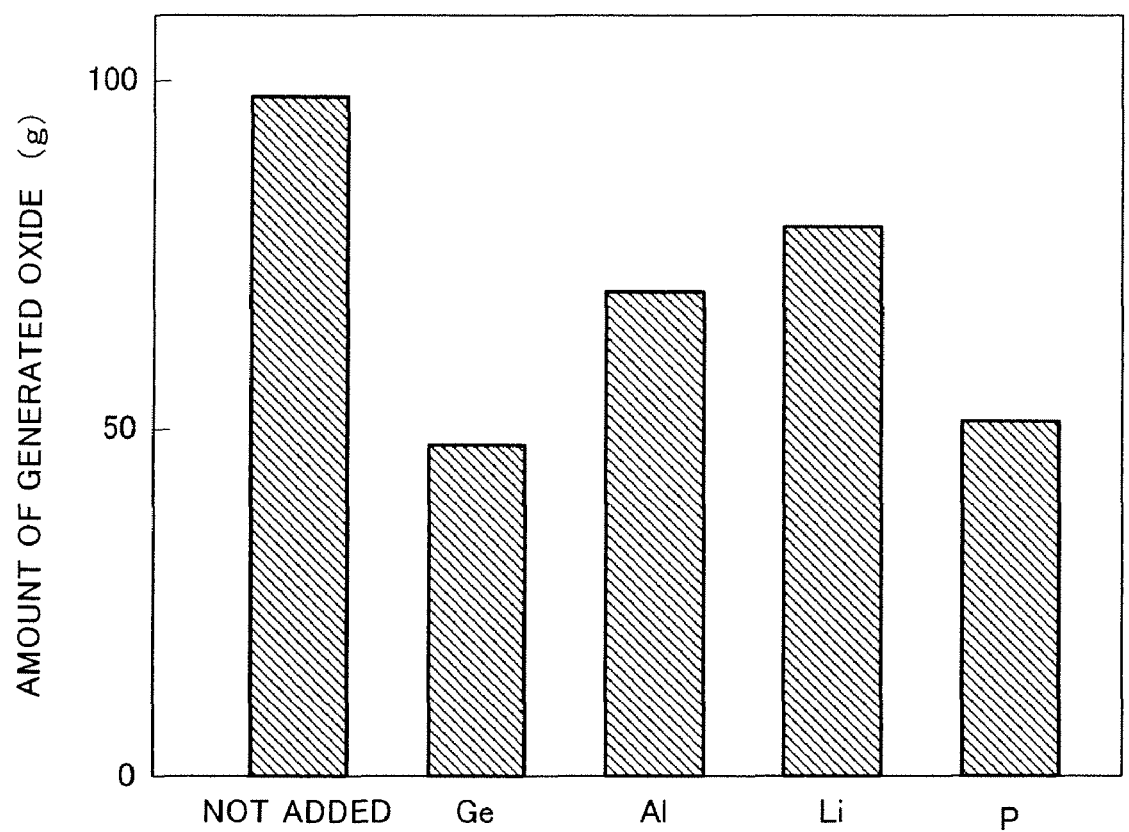
FIG. 7 shows an amount of generated oxide when one of Ge, Al, Li, and P is added to the Bi—Cu alloy.

FIG. 7 shows an amount of generated oxide when one of Ge, Al, Li, and P is added to the Bi—Cu alloy. To be specific, FIG. 7 shows an amount of oxide generated in a sample when 0.05 wt % of one of Ge, Al, Li and P is added to a eutectic alloy (Bi-0.5% Cu) composed of 99.5 wt % of Bi and 0.5 wt % of Cu and then the sample is stirred at 300° C. for four hours. The total weight of the sample is 8 kg. It is understood that the generation of oxide is suppressed particularly in a sample to which Ge is added as compared with a sample to which these elements are not added. This is because Ge is preferentially oxidized on a surface of Bi-0.5% Cu and an oxide film is formed. Thus it is understood that the addition of Ge is suitable for suppressing the oxidation of the Bi—Cu alloy.

Figure 8:
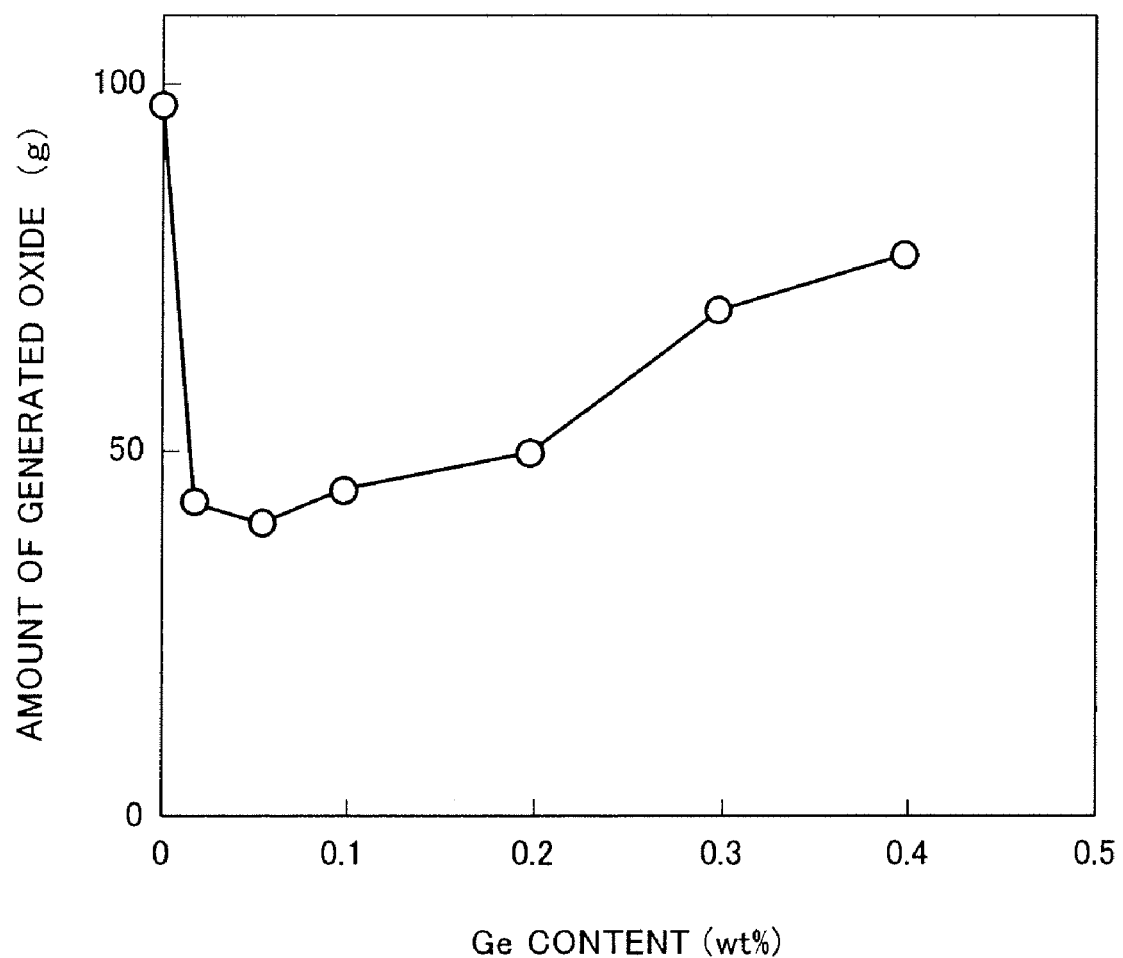
FIG. 8 shows the relationship between a Ge content and an amount of generated oxide in a Bi—Cu—Ge alloy.

FIG. 8 shows the relationship between a Ge content and an amount of generated oxide in a Bi—Cu—Ge alloy. To be specific, FIG. 8 shows the relationship between a Ge content (wt %) and an amount of generated oxide in a ternary alloy (Bi—Cu—Ge alloy) which is composed of Bi, Cu, and Ge and contains 0.5 wt % of Cu. The total weight of the alloy is 8 kg. FIG. 8 shows that a Ge content of at least 0.02 wt % suppresses the generation of oxide but a Ge content of not smaller than 0.3 wt % increases the amount of generated oxide. Further, FIG. 8 shows that a Ge content of 0.02 wt % to 0.2 wt % is preferable and a Ge content of 0.02 wt % to 0.05 wt % is more preferable.

As has been discussed, in the semiconductor device bonded to the motherboard by using a bonding material having a melting point of 200° C. to 230° C., a Bi alloy containing 0.8 wt % to 10 wt % of Cu and 0.02 wt % to 0.2 wt % of Ge is used as the bonding material that is a die bonding material for bonding the semiconductor element to the semiconductor substrate. Thus during the bonding of the semiconductor device to the motherboard by reflowing, even when the semiconductor device reaches 230° C. to 260° C., the bonding material for bonding the semiconductor element to the semiconductor substrate is not melted until about 270° C. Thus it is possible to suppress poor connection on the semiconductor element, thereby securing the mountability and electrical reliability of the semiconductor device.

Further, the bonding material of the present invention is effective especially for a semiconductor device having a small thermal capacity, thereby suppressing a failure occurring when the semiconductor device is mounted on a motherboard. Moreover, an intermetallic compound layer does not grow between the backside electrodes of the semiconductor element and a bonding member and between the metal pads of the semiconductor substrate and the bonding member. Thus a bonding state is not changed even by heat and stress applied over a long period, thereby achieving bonding with long-term reliability. Further, it is possible to suppress remelting caused by reflowing during secondary mounting, suppress the growth of an intermetallic compound, and suppress a change caused by secondary mounting, thereby achieving bonding with long-term reliability. Thus it is possible to use the bonding material as a package constituent material in consideration of reliability after secondary mounting, achieving a completely lead-free material.

Second Embodiment

A bonding material that is a die bonding material according to the present embodiment contains an alloy predominantly composed of Bi. The alloy contains 0.8 wt % to 10 wt % of Cu, 0.02 wt % to 0.2 wt % of Ge, and 0.02 wt % to 0.08 wt % of Ni. As in the first embodiment, a preferable Cu content is 6 wt % to 10 wt % and a preferable Ge content is 0.02 wt % to 0.05 wt %. Further, a Ni content of 0.02 wt % to 0.05 wt % is preferable. By adding Ni thus, shock resistance becomes higher than in the bonding material of the first embodiment.

The shock resistance can be evaluated by a test in which a weight of 60 g is caused to collide, from a height of 180 mm, against a side of a chip capacitor having a size of 1.6 mm×0.8 mm.

The shock resistance test was conducted using the chip capacitor having a joint bonded with a ternary alloy (Bi-0.5% Cu-0.04% Ge) containing 99.46 wt % of Bi, 0.5 wt % of Cu, and 0.04 wt % of Ge. As a result, the joint of the chip capacitor was broken. When observing the cross section of the joint after the break, the break was found on an interface between α phase having a high Bi content and β phase having a high Cu content.

Uniformity between the α phase and the β phase can be evaluated by a crystal perimeter value. The crystal perimeter value is defined as the total perimeter length of the α phase which is present in a range of 10 μm×10 μm. In the case of a large crystal perimeter value, the α phase and the β phase are sufficiently mixed. In the case of a small crystal perimeter value, the α phase and the β phase are insufficiently mixed.

A crystal perimeter value was measured on the cross section of the joint having been broken in the test and was found to be 87 μm.

Figure 9:
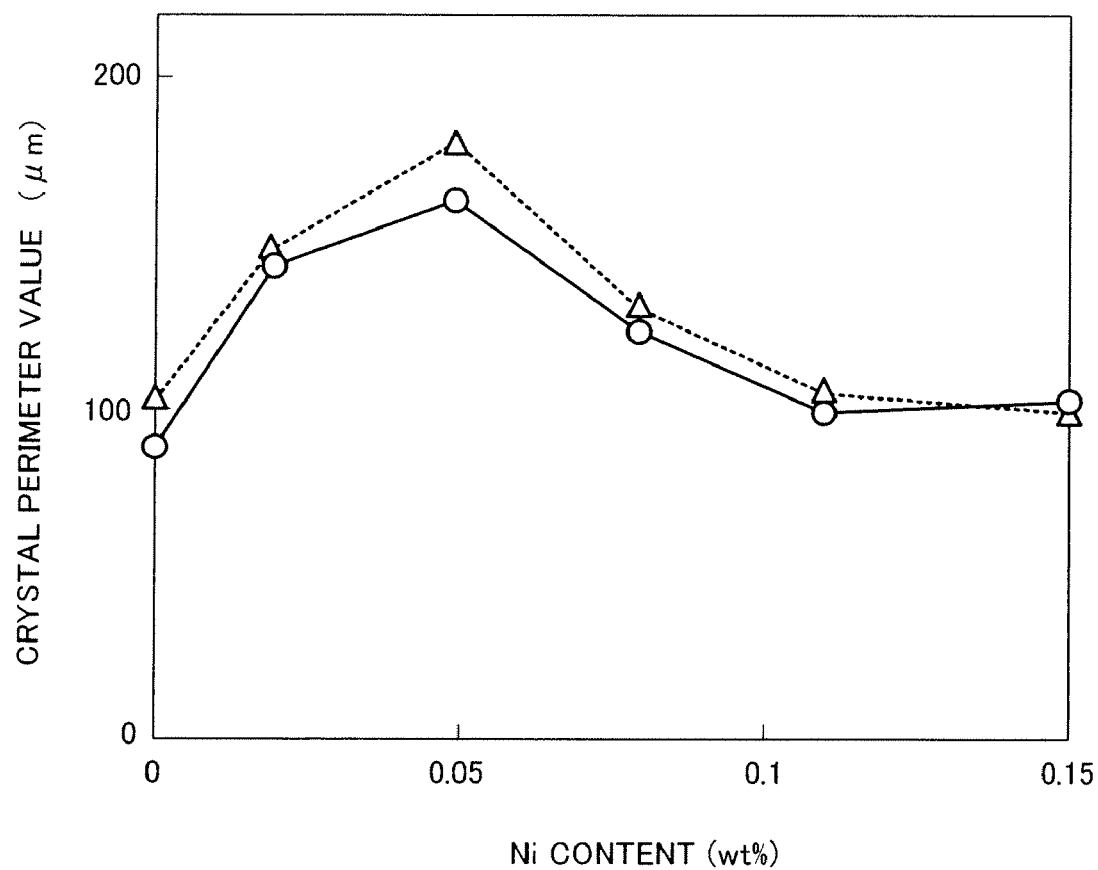
FIG. 9 shows the relationship between a Ni content in a Bi—Cu—Ge—Ni alloy and a crystal perimeter value.

FIG. 9 shows the relationship between a Ni content and a crystal perimeter value in a Bi—Cu—Ge—Ni alloy. Graph A shows the relationship between a crystal perimeter value and a Ni content (wt %) in a quarternary alloy (Bi—Cu—Ge—Ni alloy) which is composed of Bi, Cu, Ge, and Ni and contains 0.5 wt % of Cu and 0.04 wt % of Ge. Graph B shows the relationship between a crystal perimeter value and a Ni content (wt %) in a Bi—Cu—Ge—Ni alloy which contains 0.5 wt % of Cu and 0.2 wt % of Ge.

FIG. 9 shows that when the Ni content is 0.02 wt % to 0.08 wt %, the crystal perimeter value increases and the α phase and the β phase are uniformly mixed. Further, it is understood that when the Ni content is not smaller than 0.11 wt %, the crystal perimeter value decreases and the α phase and the β phase are not uniformly mixed. As shown in FIG. 9, a Ni content of 0.02 wt % to 0.08 wt % is preferable and a Ni content of 0.02 wt % to 0.05 wt % is more preferable.

As has been discussed, Ni is added to the bonding material of the first embodiment to have a Ni content of 0.02 wt % to 0.08 wt %, so that the shock resistance can be improved while keeping a melting temperature.

Third Embodiment

According to a semiconductor device of the present embodiment, when a semiconductor element having at least one semiconductor element backside electrode is mounted on a semiconductor substrate having at least one semiconductor substrate electrode, the semiconductor element and the semiconductor substrate are bonded to each other with the bonding material, which is a die bonding material according to one of the first and second embodiments, such that the semiconductor element backside electrodes and the corresponding semiconductor substrate electrodes are electrically connected to each other.

The semiconductor element is not particularly limited. For example, a semiconductor device for power may be used. Further, the semiconductor element may be a module as well as a single unit and particularly, a surface-mount device may be used.

The present invention is especially suitable when a semiconductor element for power is obtained with a size of not larger than 4.5 mm×7.6 mm in a surface-mount package.

Figure 2:
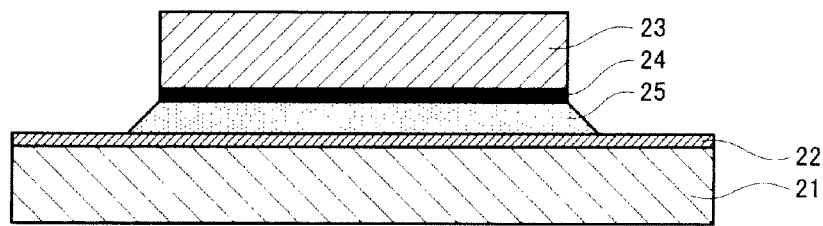
FIG. 2 shows the configuration of a semiconductor device having a metal thin film formed only on a surface of a semiconductor substrate according to the present invention.

FIGS. 1 and 2 show the relationship between the semiconductor element and the semiconductor substrate electrodes which serve as the joints of the semiconductor element.

FIG. 1 shows the configuration of the semiconductor device according to the present invention. FIG. 2 shows the configuration of the semiconductor device in which a metal thin film is formed on a surface of the semiconductor substrate according to the present invention.

In FIGS. 1 and 2, metal thin films 12 and 22 formed by Ni plating and the like are evaporated on the front and backsides (only the front side in FIG. 2) of semiconductor substrates 11 and 21, semiconductor substrate electrodes are formed on the front sides of the semiconductor substrates, that is, on the surfaces where semiconductor elements 13 and 23 are to be mounted. On the backsides of the semiconductor elements 13 and 23, that is, the mounting surfaces of the semiconductor elements 13 and 23, metal thin films 14 and 24 are evaporated and at least one semiconductor element backside electrode is formed. Further, the semiconductor elements 13 and 23 are mounted on the semiconductor substrates 11 and 21 with bonding materials 15 and 25 such that the semiconductor substrate electrodes and the semiconductor element backside electrodes are electrically connected to each other. The semiconductor device is configured thus. In this configuration, the semiconductor elements 13 and 23 and the semiconductor substrates 11 and 21 are electrically connected to each other by connecting the semiconductor substrate electrodes and the semiconductor element backside electrodes which are formed in a mounting region. Other connecting methods may be used. For example, the electrodes formed on the surfaces of the semiconductor elements 13 and 23 and the electrodes formed on the surface of the semiconductor substrates may be connected via wires and the like. The metal thin films 12 and 22 formed by Ni plating and the like are used for preventing oxidation and the diffusion of metals on the semiconductor substrates 11 and 21 to keep the bonding materials 15 and 25 as designed, so that the connection is stabilized. FIGS. 1 and 2 are different only in the presence or absence of the metal thin film 12 on the backsides of the semiconductor substrates 11 and 21, and the effect of the present invention can be obtained from both of the configurations shown in FIGS. 1 and 2.

Since the bonding material according to one of the first and second embodiments is used as the bonding materials 15 and 25, the bonding material for bonding the semiconductor element to the semiconductor substrate is not melted when the semiconductor device is bonded to a motherboard by reflowing. Thus it is possible to suppress poor connection on the semiconductor element, thereby securing the mountability and electrical reliability of the semiconductor device.

Fourth Embodiment

Figure 3A:
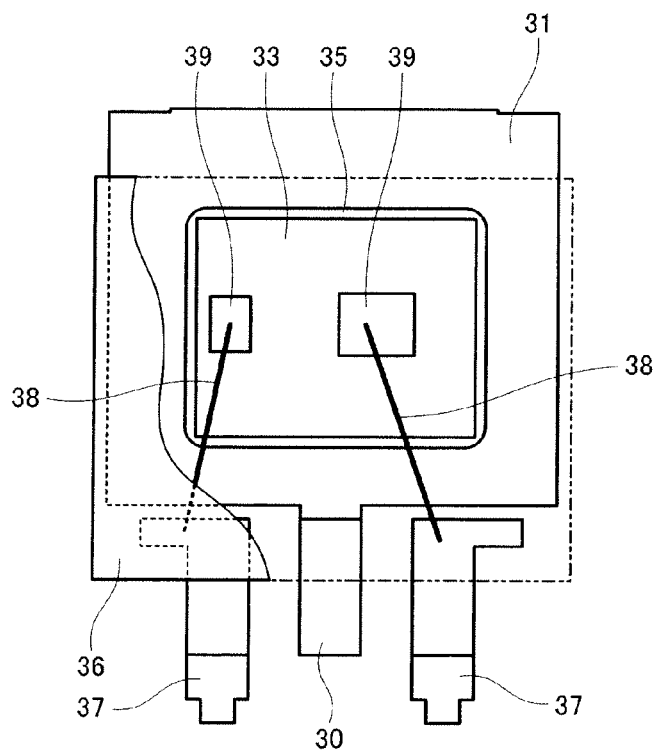
FIG. 3A shows the configuration of a semiconductor device according to the present invention.
Figure 3B:
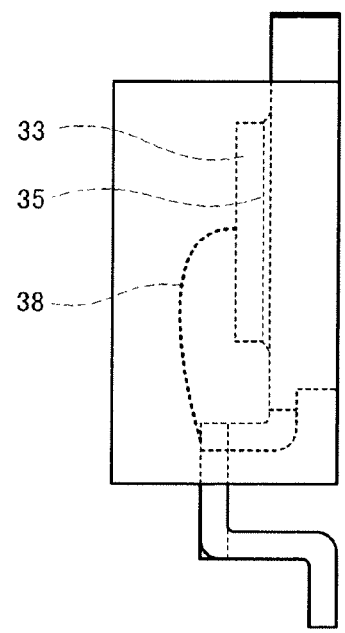
FIG. 3B shows the configuration of the semiconductor device according to the present invention.
Figure 3C:
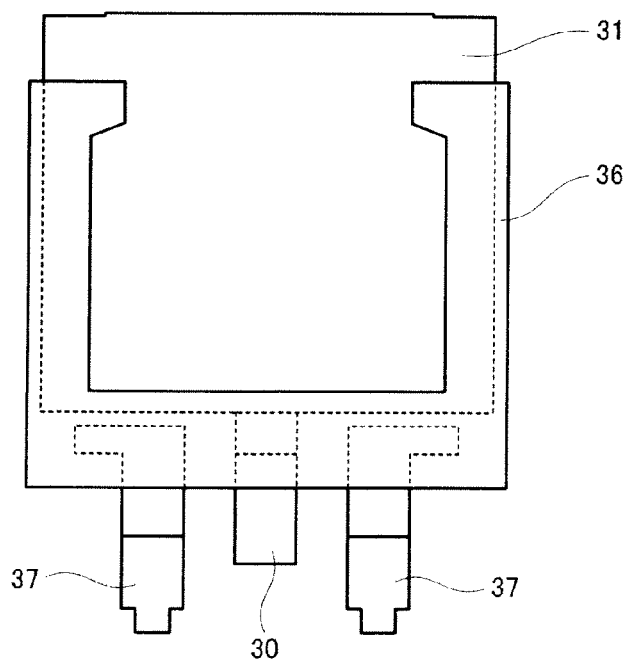
FIG. 3C shows the configuration of the semiconductor device according to the present invention.
Figure 4A:
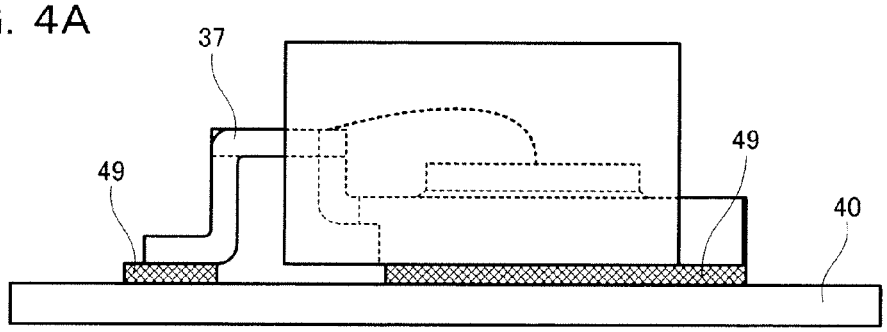
FIG. 4A is an explanatory drawing showing a mounting state of the semiconductor device according to the present invention.
Figure 4B:
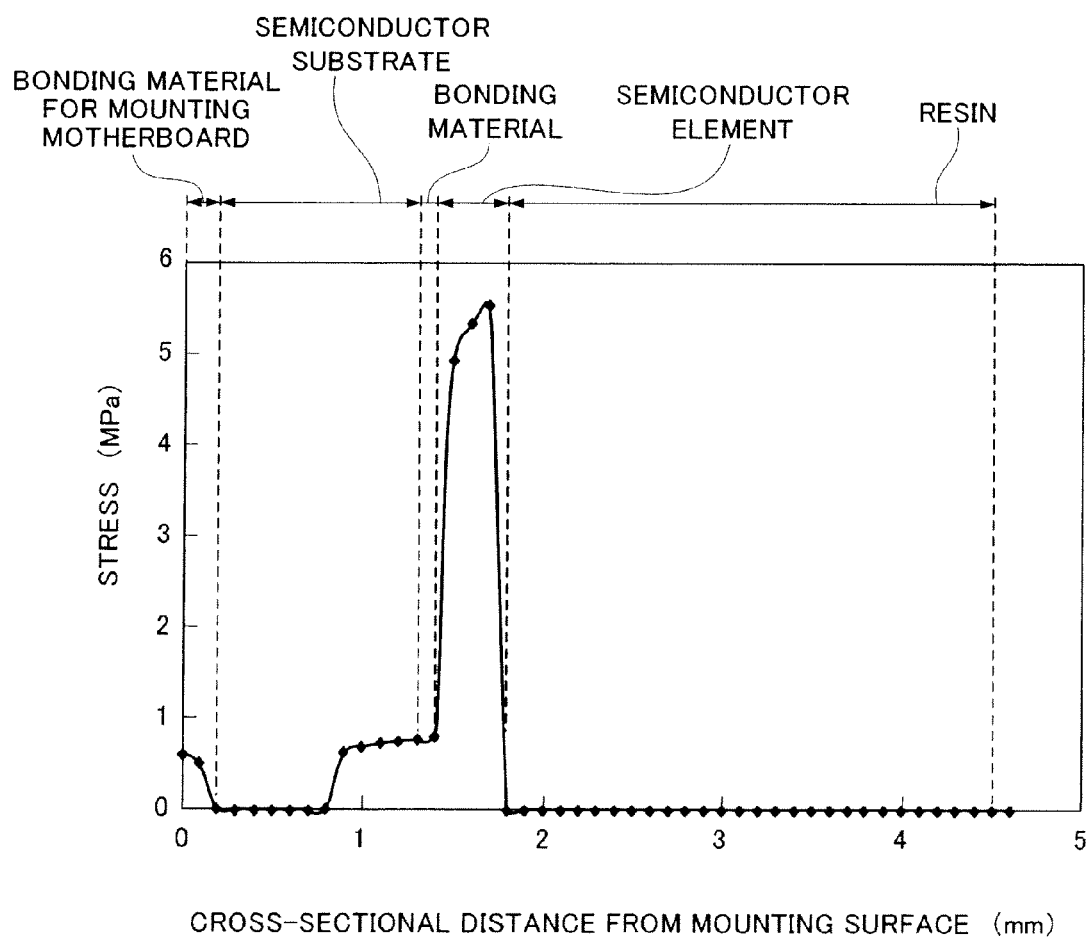
FIG. 4B is an explanatory drawing showing the mounting state of the semiconductor device according to the present invention.

Referring to FIGS. 3A, 3B, and 3C, a semiconductor device of TO-220C surface-mount type (Panasonic Corporation) will be described as an example of a semiconductor device of the present embodiment. FIGS. 4A and 4B show a portion where the highest stress is applied when the semiconductor device is mounted on a motherboard.

FIGS. 3A, 3B, and 3C show the configuration of the semiconductor device according to the present invention. FIG. 3A is a plan view of the semiconductor device and is also a partial perspective view of resin. FIG. 3B is a side view of the semiconductor device. FIG. 3C is a back view of the semiconductor device. FIGS. 4A and 4B are explanatory drawings showing a mounting state of the semiconductor device according to the present invention. FIG. 4A is a side view and FIG. 4B shows the relationship between a distance between the semiconductor device and a surface of the motherboard and a stress.

As shown in FIGS. 3A, 3B, and 3C, a semiconductor substrate 31 includes semiconductor substrate electrodes which are connected to the backside electrodes of a semiconductor element 33 in a region where the semiconductor element 33 is mounted, an external metal terminal 30 which is electrically connected to the semiconductor substrate electrodes, and external metal terminals 37 which are not electrically connected to the semiconductor substrate electrodes. The semiconductor element 33 includes the semiconductor element backside electrodes which are disposed on the backside of the semiconductor element 33 so as to be connected to the semiconductor substrate electrodes, and metal electrode pads on the frontside of the semiconductor element 33. In the semiconductor device of the fourth embodiment, the semiconductor element 33 is mounted on the semiconductor substrate 31 and is bonded with a bonding material, which is the die bonding material according to the first and second embodiments, such that the semiconductor substrate electrodes and the semiconductor element backside electrodes are electrically connected to each other. Further, metal electrode pads 39 and the external electrode terminals 37 are connected to each other via metal wires 38. Moreover, the semiconductor device is molded with resin 36 so as to protect the semiconductor element 33 and the metal wires 38. The end of the external metal terminal 30 electrically connected to the semiconductor element 33 and the ends of the external metal terminals 37 are exposed from the resin 36.

As shown in FIGS. 4A and 4B, the semiconductor device of FIGS. 3A, 3B, and 3C is mounted by bonding the backside of the semiconductor device and the external metal terminals 37 to a motherboard 40 with a bonding material 49 for mounting the motherboard.

When the semiconductor device is a resin package shown in FIGS. 3A, 3B, and 3C, the external metal terminals 37 and the motherboard are electrically connected to each other by soldering as shown in FIG. 3C viewed from a motherboard mounting surface. In FIG. 4A, the external metal terminals 37 are bonded to the motherboard 40 with the bonding material 49 for mounting the motherboard.

In other words, provided are the semiconductor device, the motherboard for mounting the semiconductor device, and a first bonding material which is a bonding material for bonding the semiconductor device and the motherboard. The first bonding material includes a first alloy.

The semiconductor device includes the semiconductor element, the semiconductor substrate electrodes connected to the semiconductor element, and a second bonding material for bonding the semiconductor element and backside metal electrodes. The second bonding material is composed of a bonding material which is the die bonding material according to one of the first and second embodiments.

The first boding material is preferably melted by heat applied by reflow equipment and has a melting temperature of, for example, 200° C. to 230° C. A number of bonding materials having this melting temperature have been proposed in the prior art and can be easily obtained by a person skilled in the art.

The second bonding material has a higher melting temperature than the melting temperature of the first bonding material. Thus when the semiconductor device is mounted on the motherboard, even the use of reflow equipment does not melt the second bonding material in the semiconductor device. It is therefore possible to suppress poor connection on the semiconductor element, thereby securing the mountability and electrical reliability of the semiconductor device.

In the case of a package shown in FIGS. 3A, 3B, and 3C, the semiconductor device has to be mounted as shown in FIG. 4A because the semiconductor device is surface-mount type. As shown in FIG. 4B, the semiconductor element is likely to become cracked because the semiconductor device is a structure in which an extremely high stress is applied to the semiconductor element as heat is conducted. For this reason, the semiconductor element may become cracked or the heat dissipation of the semiconductor element may deteriorate because of voids in the second bonding material or fixation in an unstable state in the semiconductor device. It is therefore more important to provide a bonding material which can suppress poor connection on the semiconductor element with an increased melting temperature and can secure the mountability and electrical reliability of the semiconductor device.

What is claimed is:

1. A semiconductor device having a semiconductor element mounted on a semiconductor substrate,
   the semiconductor device comprising:
   at least one external metal terminal formed on the semiconductor substrate;
   a joint for electrically connecting the semiconductor element and the semiconductor substrate via electrodes; and
   a die bonding material made of an alloy predominantly composed of Bi for bonding the semiconductor element and the semiconductor substrate,
   wherein the alloy contains 0.8 wt % to 10 wt % of Cu and 0.02 wt % to 0.2 wt % of Ge.

2. The semiconductor device according to claim 1, wherein the alloy contains 0.8 wt % to 3.8 wt % of Cu and 0.02 wt % to 0.05 wt % of Ge.

3. The semiconductor device according to claim 1, wherein the alloy further contains 0.02 wt % to 0.08 wt % of Ni.

4. The semiconductor device according to claim 2, wherein the alloy further contains 0.02 wt % to 0.08 wt % of Ni.

5. The semiconductor device according to claim 1, wherein the alloy further contains 0.02 wt % to 0.05 wt % of Ni.

6. The semiconductor device according to claim 2, wherein the alloy further contains 0.02 wt % to 0.05 wt % of Ni.

7. A die bonding material for bonding a semiconductor element to a semiconductor substrate,
   wherein the die bonding material is an alloy which is predominantly composed of Bi and contains 0.8 wt % to 10 wt % of Cu and 0.02 wt % to 0.2 wt % of Ge.

8. The die bonding material according to claim 7, wherein the alloy contains 0.8 wt % to 3.8 wt % of Cu and 0.02 wt % to 0.05 wt % of Ge.

9. The die bonding material according to claim 7, wherein the alloy further contains 0.02 wt % to 0.08 wt % of Ni.

10. The die bonding material according to claim 8, wherein the alloy further contains 0.02 wt % to 0.08 wt % of Ni.

11. The die bonding material according to claim 7, wherein the alloy further contains 0.02 wt % to 0.05 wt % of Ni.

12. The die bonding material according to claim 8, wherein the alloy further contains 0.02 wt % to 0.05 wt % of Ni.

* * * * *